United States Patent [19]

Pirker

[11] Patent Number: 5,896,877
[45] Date of Patent: Apr. 27, 1999

[54] SUPPORT FOR WAFER-LIKE OBJECTS

[75] Inventor: Willibald Pirker, Bad Bleiberg, Austria

[73] Assignee: SEZ Semiconductor-Equipment Zubehor Fur Die Halbleiterfertigung AG, Villach, Austria

[21] Appl. No.: 08/971,754

[22] Filed: Nov. 17, 1997

[30] Foreign Application Priority Data

Nov. 20, 1996 [AT] Austria ................................ 2024/96

[51] Int. Cl.$^6$ ............................................ B08B 3/02
[52] U.S. Cl. ........................... 134/153; 134/157; 134/902
[58] Field of Search .............................. 134/99.1, 157, 134/153, 140, 201, 902; 118/219, 320; 156/345

[56] References Cited

U.S. PATENT DOCUMENTS 5,513,668 5/1996 Sumnitsch ............................ 34/157

Primary Examiner—Frankie L. Stinson
Assistant Examiner—Mialeeka C. Williams-Bibbs
Attorney, Agent, or Firm—Young & Thompson

[57] ABSTRACT

In the case of a support 1 for wafer-like object 2, which in its surface facing toward wafer-like object 2 has a ring-shaped die 8 for the discharge of compressed gas, there is a circular step 10 that is located radially outside of ring-shaped die 8. Treatment fluid 15, which is applied to the upper side of an object 2, which is secured to a support 1 that is equipped with step 10, flows around circumferential edge 16 of object 2 onto underside 17 of said object and wets an area of underside 17 of object 2 that is located radially outside of step 10 until it is blown away radially outward by the gas emerging from tubular die 8. This provides the advantage that treatment fluid 15 not only reaches circumferential edge 16 of object 2, but also reaches into a ring-shaped area of underside 17 of wafer-like object 2 that faces toward support 1 and can exert its action there.

4 Claims, 2 Drawing Sheets

SUPPORT FOR WAFER-LIKE OBJECTS

This invention pertains to a support for wafer-like objects, and especially supports for silicon wafers during treatment, especially etching thereof, with the features of the introductory part of claim 1.

Such supports ("chucks") are known in various embodiments. In principle, there are two embodiments, namely supports which, on the surface facing the object to be held, have pegs which hold the wafer-like object facing toward the side (see U.S. Pat. No. 4,903,717 A and U.S. Pat. No. 5,513,668 A) and supports which secure the wafer-like object to the support by applying an underpressure (see U.S. Pat. No. 5,421,595A).

The known supports make it possible to treat wafer-like objects on their surfaces that face away from the support, whereby the surface facing toward the support is not treated since the treatment medium (e.g., the etching fluid) is prevented from reaching the underside of the support by the gas (primarily nitrogen) that emerges from the tubular die and flows radially outward between the wafer-like object and the surface of the support that faces toward said object.

It is frequently necessary, however, also to treat the edge area of the wafer-like object, especially a silicon wafer, on the side facing the support. This cannot be readily accomplished with the support designs that are commonly employed today.

The object of the invention is therefore to provide a support that not only makes it possible to treat, with a treatment medium, the side of the wafer-like object that faces away from the support, but also the outer edge and a ring-shaped edge area of the side of the wafer-like object facing the support.

According to the invention, this object is achieved by the features of the characterizing part of claim 1 with a support of the type mentioned in the introduction.

Preferred and advantageous embodiments of the support according to the invention are the subjects of the sub-claims.

Owing to the step, especially a round one, that is provided in the surface facing the wafer-like object, that is arranged outside of the tubular die through which the nitrogen gas emerges, and that acts as a tear-away edge, treatment medium (treatment fluid, etching fluid, flushing fluid) moves around the outer edge of the wafer-like object on its underside (that is, the side facing the support) and treats, e.g., etches or flushes, the wafer-like object essentially in a ring-shaped area that is located outside the shoulders on its underside. It is advantageous for the gas stream that emerges from the tubular die and flows out between the object and the base to prevent the treatment medium from moving further than desired toward the middle of the wafer-like object.

BRIEF DESCRIPTION OF THE DRAWINGS

Additional details, features, and advantages of the support according to the invention are presented in the following discussion of the invention, in which reference is made to the drawings in which a support according to the invention is shown in sample embodiments.

Here.

Figure 1:
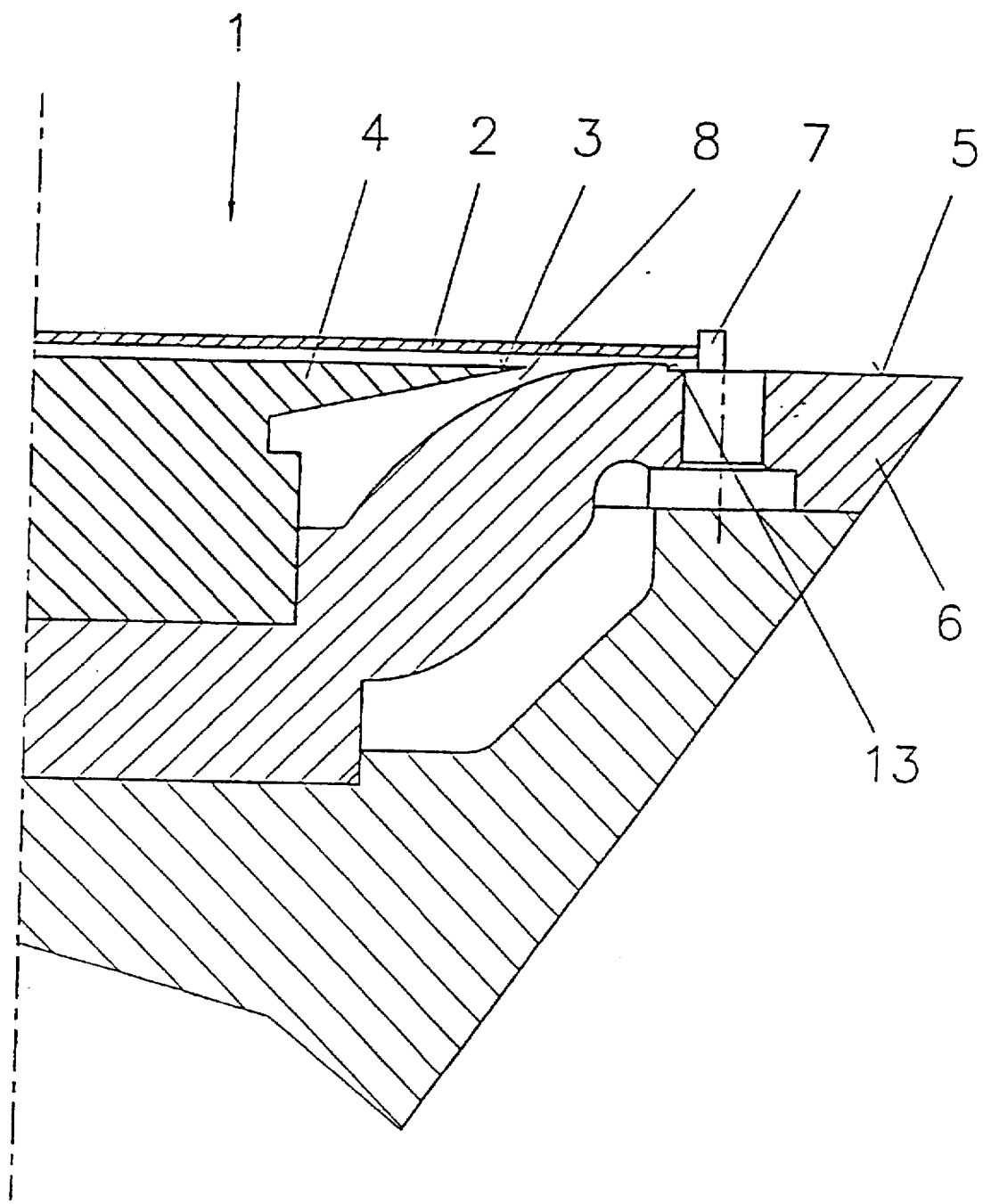
FIG. 1 shows a support with a silicon wafer attached to it.

A support 1 that is shown in FIG. 1 is basically known from U.S. Pat. No. 4,903,717 A and U.S. Pat. No. 5,513,668 A. In the case of this known support 1, its surface that faces wafer-like object 2 is formed by a circular surface 3 of an inner part 4 and a ring surface 5 of an outer (ring-shaped) part 6. In outer part 6 there are several radially adjustable pegs 7 ("pins") by which object 2 (e.g., a silicon wafer) is laterally supported.

Between inner part 4 and outer part 6 of support 1 is a ring-shaped die 8 that is designed as an annular gap between parts 4 and 6. Ring-shaped die 8 is loaded with compressed gas, primarily nitrogen, so that wafer-like object 2 is secured to support 1 in accordance with the Bernoulli principle, whereby it "hovers" in a state of equilibrium uniformly over surfaces 3 and 5.

In surface 5 of outer part 6 of support 1, which surface faces toward wafer-like object 2, there is a step 10 that is located just outside die 8. Said step 10 results from the fact that the radially outer part of surface 5 is recessed downward with respect to the part of surface 5 that is radially on the inside.

Figure 2:
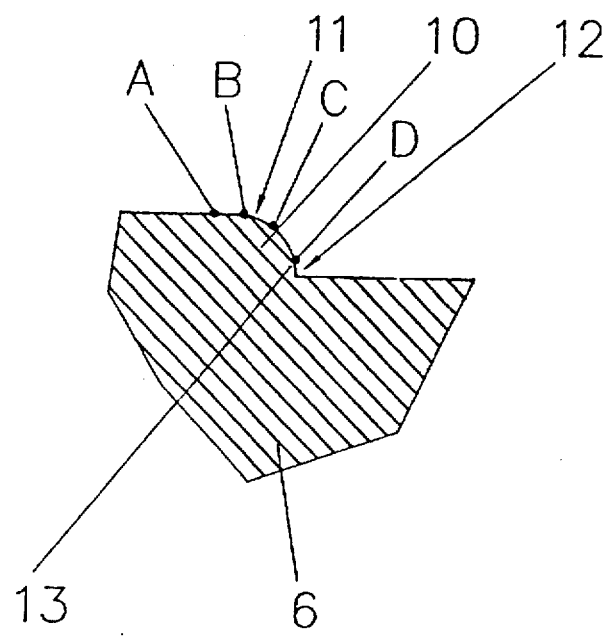
FIG. 2 shows an enlarged detail in the area of the step.

FIG. 2 shows that edge 11 of step 10 is rounded, whereby transition 12 between outward-pointing surface 13 of step 10 and the part of surface 5 of outer part 6 that faces toward wafer-like object 2, whereby said part lies radially outside of step 10, is sharp or is designed to have a very small radius of curvature.

In a preferred embodiment of the invention, the radius of curvature of step 10, which is shown in cross-section in FIG. 2, gradually decreases as it moves radially outward. Thus, the radius of curvature in the area between A and B, for example 3 mm, can be for example 0.8 mm in the area between B and C, and for example 0.2 mm in the area between C and D.

Figure 3:
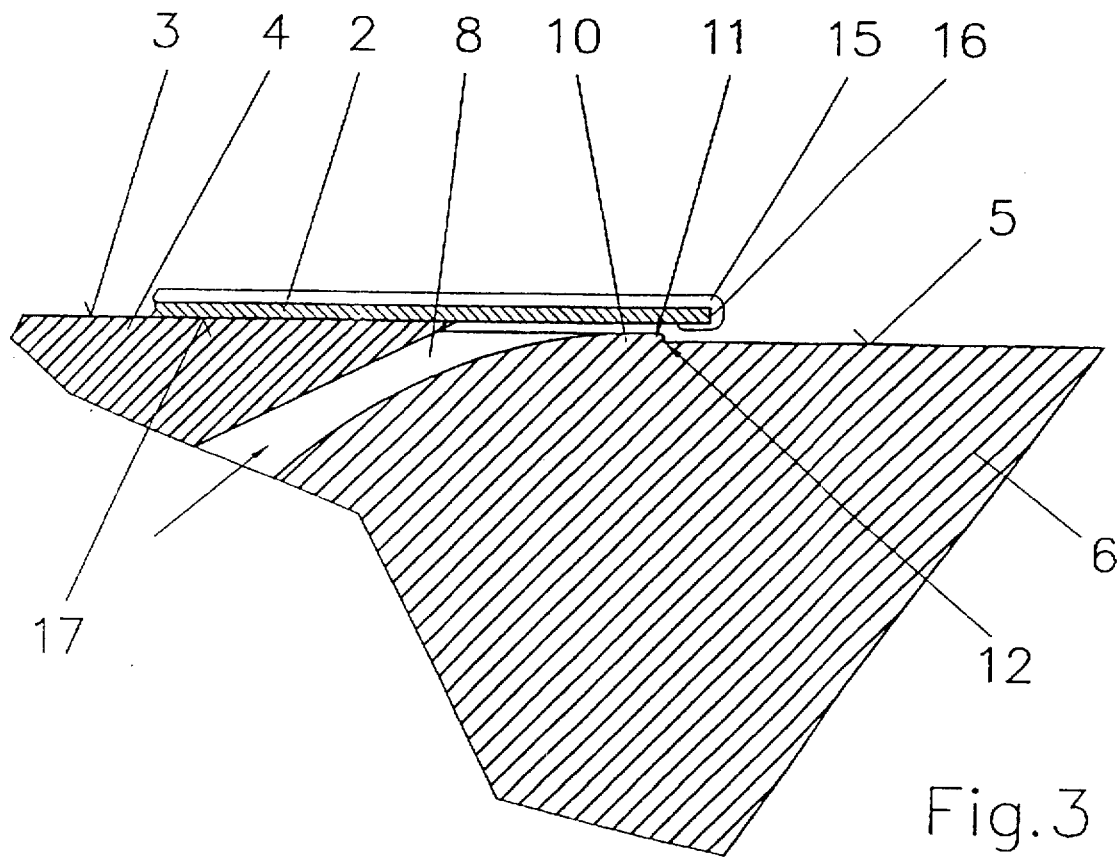
FIG. 3 shows the flow conditions in the area of the step.

Step 10 dictates the flow conditions of treatment medium 15, which are schematically depicted in FIG. 3. A treatment medium 15, e.g., an etching fluid, which is applied to the top side (the side facing away from support 1) of wafer-like object 2 is not, as occurs in the case of known supports, largely or completely blown away from circumferential edge 16 of wafer-like object 2 by the gas that emerges from tubular die 8 and flows out between wafer-like object 2 and support 1, so that said medium cannot reach the underside of said object. Rather, treatment medium 15 flows around circumferential edge 16 of wafer-like object 2 on its underside 17 until it reaches approximately the area of step 10. Thus, a ring-shaped area of underside 17 of wafer-like object 2 that faces toward support 1 is wetted and treated by treatment medium 15. The stream of gas flowing out of tubular die 8 thus prevents treatment medium 15 from moving further inward on the underside of object 2 since the stream of gas from tubular die 8 acts to keep treatment medium 15 from creeping inward in an area that is located radially on the inside from step 10.

Step 10 that is provided by the invention can, as shown in FIG. 3, also be used in the case of supports in which wafer-like object 2 is not laterally secured by pegs, but rather is secured against, e.g., ring-shaped projections of the support. Such a support is known from, for example, U.S. Pat. No. 5,492,566 A.

For support 1 according to the invention, it is of very little importance how the wafer-like object is secured to the support (Bernoulli principle/pegs (pins)/applied underpressure) since, for the effect that is achieved according to the invention of wetting, with treatment medium 15, circumferential edge 16 and a ring-shaped area on surface 17 of wafer-like object 2 that faces toward support 1, only step 10 and the gas flowing out of ring-shaped die 8 are decisive.

An embodiment of the invention can be described in summary form as follows:

In the case of a support 1 for wafer-like objects 2, which in its surface that faces toward wafer-like object 2 has a ring-shape die 8 for the discharge of compressed gas, there is a circular step 10 that is located radially on the outside from ring-shape die 8. Treatment fluid 15, which is applied to the upper side of an object 2, which is secured to a support that has step 10, flow around circumferential edge 16 of object 2 onto underside 17 of said object and wets an area of underside 17 of object 2 that is located radially outside of step 10 until it is blown away radially outward by the gas emerging from tubular die 8. This provides the advantage that treatment fluid 15 is able to reach not just circumferential edge 16 of object 2, but also reaches into a ring-shaped area underside 17 of wafer-like object 2 that faces toward support 1 in a ring-shaped area and can exert its action there.

I claim:

1. Support (1) for wafer-like objects (2) with a surface (3, 5) facing toward object (2) that is to be held, in which a ring-shaped nozzle (8) that is loaded with compressed gas is provided concentric to the axis of support (1), wherein in surface (5) of support (1) that faces towards wafer-like object (2) a circular step (10) that slopes off to the outside and is arranged concentrically with respect to ring-shaped die (8) is provided radially outside of ring-shaped die (8), wherein the part of surface (5) of support (1) that faces toward wafer-like object (2) and is located outside of step (10) is further from wafer-like object (2) than the part of said surface (5) that is located inside of step (10).

2. Support (1) for wafer-like objects (2) with a surface (3, 5) facing toward object (2) that is to be held, in which a ring-shaped nozzle (8) that is loaded with compressed gas is provided concentric to the axis of support (1), wherein in surface (5) of support (1) that faces towards wafer-like object (2) a circular step (10) that slopes off to the outside and is arranged concentrically with respect to ring-shaped die (8) is provided radially outside of ring-shaped die (8), wherein transition (11) between surface (5) facing towards the wafer-like object and front (13) of step (10) that points radially outward is rounded off.

3. Support according to claim 2, wherein transition (11) is designed to have steadily smaller radii with respect to radially outward-pointing front (13) of step (10).

4. Support (1) for wafer-like objects (2) with a surface (3, 5) facing toward object (2) that is to be held, in which a ring-shaped nozzle (8) that is loaded with compressed gas is provided concentric to the axis of support (1), wherein in surface (5) of support (1) that faces towards wafer-like object (2) a circular step (10) that slopes off to the outside and is arranged concentrically with respect to ring-shaped die (8) is provided radially outside of ring-shaped die (8), wherein transition (12) between surface (13) of step (10) that points radially outward and the part of surface (5) of support (1) that faces towards wafer-like object (2) and is located outside of step (10) is designed to have a sharp edge.

* * * * *